United States Patent [19]

Rumbaugh et al.

[11] Patent Number: 5,159,262
[45] Date of Patent: Oct. 27, 1992

[54] METHOD FOR MEASURING THE ELECTRICAL AND OPTICAL PERFORMANCE OF ON-WAFER MICROWAVE DEVICES

[75] Inventors: Scott H. Rumbaugh, Lake Oswego; Andrew C. Davidson, Portland, both of Oreg.

[73] Assignee: Cascade Microtech, Inc., Beaverton, Oreg.

[21] Appl. No.: 727,566

[22] Filed: Jul. 9, 1991

[51] Int. Cl.$^5$ .................... G01R 27/04; G06F 15/20
[52] U.S. Cl. .................... 324/158 R; 324/73.1; 324/77 A; 324/158 D; 364/571.01
[58] Field of Search ........... 324/158 R, 158 D, 158 T, 324/73.1, 77 A, 77 K, 642; 250/310, 311; 364/571.01

[56] References Cited

U.S. PATENT DOCUMENTS

| | | | |
|---|---|---|---|
| 4,695,794 | 9/1987 | Bargett et al. | 324/158 D |
| 4,730,158 | 3/1988 | Kasai et al. | 324/158 D |
| 4,858,160 | 8/1989 | Strid et al. | 364/571.01 |
| 4,896,109 | 1/1990 | Rauscher | 324/158 D |
| 4,933,634 | 6/1990 | Cuzin et al. | 324/158 D |

OTHER PUBLICATIONS

Fraser et al., "GHz On-Silicon-Wafer Probing Calibration Methods," Proceedings 1988 Bipolar Circuits and Technology Meeting, pp. 154-157, Jul. 1988.
Modolo et al., "Wafer Level High-Frequency Measurements of Photodetector Characteristics," *Applied Optics*, vol. 27, pp. 3059-3061, Aug. 1988.
Cascade Microtech, Inc., "Electrical Operation," Model 22-42D Microwave Probe Station Instruction Manual, Chap. 4, pp. 4-25 to 4-42 (1987).
Swanson, D., "Ferret Out Fixture Errors With Careful Calibration," Microwaves, pp. 79-85, Jan. 1980.

*Primary Examiner*—Vinh Nguyen
*Attorney, Agent, or Firm*—Chernoff, Vilhauer, McClung & Stenzel

[57] ABSTRACT

A method for on-wafer testing of microwave devices, such as photodiodes, including a biasing method applicable when the device has a lower end connected to the ground plane of the wafer. Elements having a diode-like characteristic, such as photodiodes, are arranged side-by-side with the device, each preferably being of like geometry with the device, and each having an end connected to the ground plane. A first voltage is applied between the ground conductors of the probe and the ground plane of the wafer to place each element in forward-biased condition thereby creating a return path for the lower end of the device to the ground conductors located on the upper side of the wafer. The method further includes a calibration method for accurate measurements of photodetectors particularly when they are biased as described above, including measuring a performance parameter, such as responsivity, that characterizes the optical performance of the photodetector, measuring a network parameter, such as a reflection coefficient, that characterizes the electrical performance of the photodetector, and determining an adjusted value for the performance parameter based on the network parameter in which the reference plane of the measured performance parameter has been shifted so as to better characterize the intrinsic response of the photodetector without interference by the surrounding measurement environment. Specific steps for removing probe effects and return path diode effects are described.

24 Claims, 5 Drawing Sheets

METHOD FOR MEASURING THE ELECTRICAL AND OPTICAL PERFORMANCE OF ON-WAFER MICROWAVE DEVICES

BACKGROUND OF THE INVENTION

The present invention relates to a method for on-wafer testing of microwave devices and, in particular, to a method for testing a photodiode that is connected, at one end, to a probeable contact on the upper side of the wafer and, at the other end, to a ground plane on the lower side of the wafer.

When testing microwave devices, there is often a choice made either to test each device "on-wafer" or, in the alternative, to dice the wafer and to separately package each device for measurement. This latter approach is time-consuming, however, due to the extra interconnecting and packaging steps involved. Moreover, the interconnect structures that are used, such as bond wires, add their own electrical effects which can only be compensated for at additional expense. Furthermore, if measurements are made that indicate inferior performance by particular devices, only the "on-wafer" approach permits further processing to occur to improve such performance. For these reasons, on-wafer testing, where feasible, has been the preferred testing approach for high speed wafer devices.

The feasibility of on-wafer testing of a three-terminal transistor by a pair of probes was described by Arthur Fraser, Reed Gleason and Eric Strid in "GHz ON-SILICON WAFER PROBING CALIBRATION METHODS," Proceedings of the 1988 Bipolar Circuits and Technology Meeting, Paper 7.6, Pub. No. 88CH2592-4, pp. 154-157, Jul. 1988. The described set-up included setting the ground conductors of one probe at a lower potential than the corresponding ground conductors of the other probe so that a pair of adjacent transistors, one on each side of the transistor under test, could effectively shunt the ground conductors of each probe together through their forward biased base-emitter junctions. The remaining collector terminal of each transistor was returned to the ground plane on the underside of the wafer. This two-probe measurement approach, however, has not appeared of particular relevance to the testing of two-terminal devices, such as photodiodes, which are accessible only by a single electrical probe at a time.

A method for on-wafer testing of photodiodes has been described by John Modolo, Gordon Anderson, Francis Kub, and Ingham Mack in "Wafer Level High-Frequency Measurements of Photodetector Characteristics," Applied Optics, Vol. 27, pp. 3059-3061, Aug. 1988. In this method, the signal and ground conductors of the probe were placed directly onto the pair of upper contacts between which the photodiode was connected, and an optical probe was used to apply light to the photodiode. The particular approach used to calibrate the measurements made in this setup was not, however, described in any detail, although a standard lightwave analyzer calibration set appeared to be involved. Such sets have customarily included, for reference purposes, a photoreceiver of known characteristic which is attachable in place of the microwave probe at the coaxial termination of the interconnecting cable. To calibrate for the effects of the probe in the described setup, however, reference is needed to the probe tip and requires, for example, the use of a probeable photodiode standard, an additional accessory that would need to be specially purchased for making this type of measurement.

A further difficulty with the above-described method is its lack of adaptability to other commonly encountered device configurations, such as where the photodiode, rather than having both ends terminated on the upper side of the wafer, instead has one end terminated to the ground plane on the lower side of the wafer. In this configuration, the noncoplanar ends of the photodiode are not directly accessible by a standard microwave probe having coplanar probe leads, thereby requiring the use of a specially constructed probe.

Accordingly, it is an object of the present invention to provide a method for accurate testing of two-terminal microwave devices on-wafer and without the use of special equipment or accessories.

A related object of the present invention is to permit the use of a standard microwave probe, having coplanar conductors at its probe tip, for on-wafer testing of two-terminal microwave devices, particularly those of the type that connect, at one end, to a single probeable contact on the upper side of the wafer and connect, at their other end, with a common ground plane on the lower side of the wafer.

Another related object is to enable accurate testing using a standard microwave probe where the device under test is a photodetector and an optical characteristic is being measured.

A further object of the present invention is to facilitate calibration of the on-wafer measurement of an optical characteristic of a photodetector without the use of a probeable photodetector standard.

Another object of the present invention is to facilitate calibration of the on-wafer measurement of a two-terminal microwave device to correct for errors introduced by taking the measurement through a nonideal ground path.

SUMMARY OF THE INVENTION

In achieving the aforementioned objects the present invention includes an on-wafer biasing method which permits two-terminal microwave devices of the type having noncoplanar ends to be probed by a standard probe having coplanar conductors. In particular, an on-wafer diode is provided in side-by-side arrangement with the microwave device so that the diode and the microwave device each connect to a separate contact on the upper side of the wafer but on the lower side are both connected to the same ground plane. The spacing between the separate contacts is matched to the spacing of the conductors at the tip end of the probe. While the diode is being placed in forward-biased condition, by a first voltage applied between the ground conductor of the probe and the ground plane of the wafer, a performance parameter characterizing the device is measured between the signal and ground conductors of the probe. In this manner the diode provides a return path from the lower side connection of the microwave device to the probe located on the upper side.

Either in conjunction with or separate from the biasing method, the present invention includes a calibration method that permits accurate on-wafer testing of photodiodes or other types of photodetectors without special equipment. The steps involved include measuring a reference parameter characterizing the optical performance of the photodetector from a first reference plane, measuring a network parameter characterizing the electrical performance of the photodetector, and determining an adjusted value for the performance parameter based on the network parameter so that the response of the photodetector is characterized from a second reference plane nearer to the photodetector than the first reference plane.

The performance parameter can include, for example, the responsivity of the diode and the network parameter can include a reflection coefficient. The second reference plane can be located directly across the ends of the photodetector permitting a more realistic measurement of intrinsic device performance without degradation by the surrounding measurement environment. The first reference plane, in contrast, is normally located at the attachment end of the probe unless a special probeable calibration standard is available in which case the first reference plane shifts to the probe tip. For photodetectors that have noncoplanar ends, however, this shift is still not enough to bring the first reference plane directly across the photodetector.

DETAILED DESCRIPTION OF THE INVENTION

Figure 1:
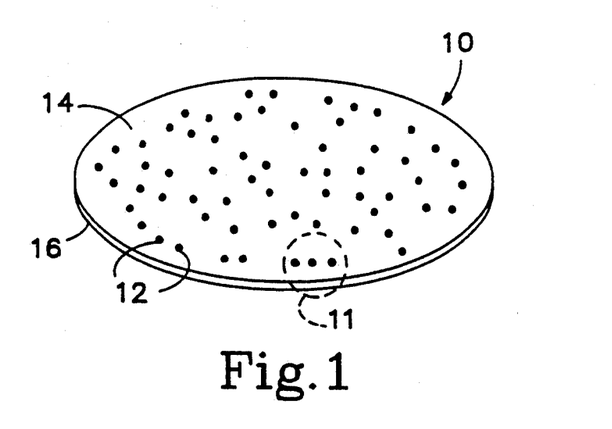
FIG. 1 is a perspective view of a wafer which carries devices of a type suitable for testing in accordance with an exemplary method of the present invention.
Figure 2:
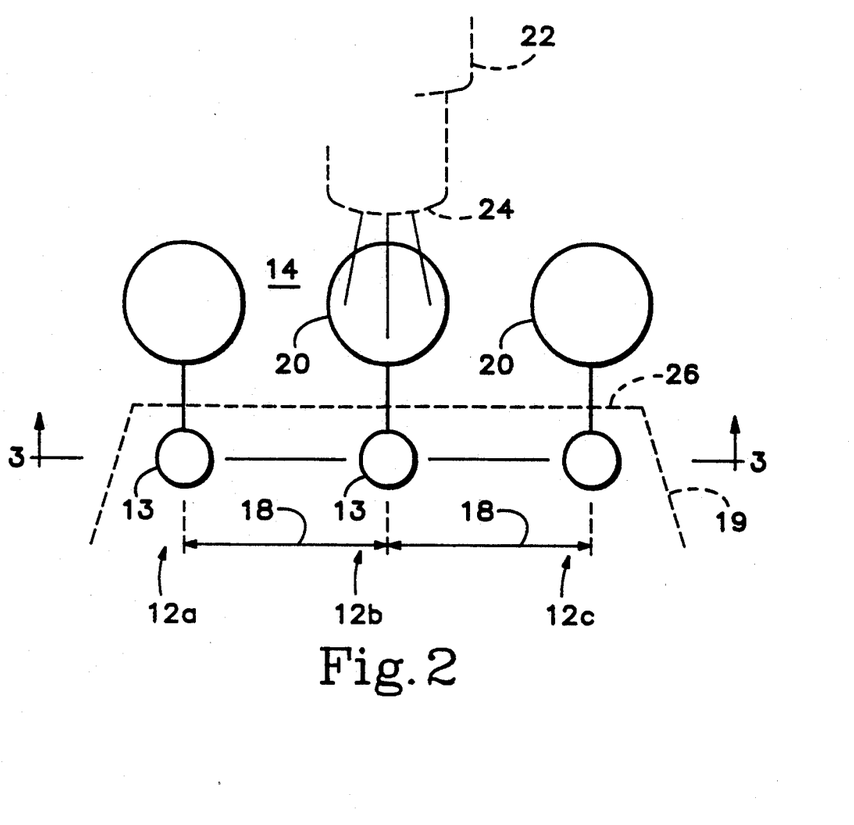
FIG. 2 shows, in accordance with the exemplary method, an enlarged planar view of three photodiodes that are carried within the circled region on the wafer of FIG. 1, the output port of an optical probe, in phantomline view, applying light to the center one of the photodiodes, and the tip end of an electrical probe, in dashed-line view, positioned in contact with each of the three photodiodes.

FIG. 1 shows a wafer 10 in which are formed a number of individual photodiodes 12 that require test. Referring also to FIG. 2 showing an enlarged planar view of the circled region 11 in FIG. 1, each photodiode 12a–c has one end connected to a probeable contact or bond pad 13 located on the upper side 14 of the wafer, while the other end (not shown) of each photodiode is connected to the common ground plane 16 that extends across the entire lower side of the wafer.

In accordance with the exemplary method of the present invention, in side-by-side relationship with each photodiode 12b that is to be tested, a pair of closely adjacent outer photodiodes 12a and 12c are preferably provided, the photodiodes having a physical geometry that desirably is substantially identical to each other, and having their bond pads 13 separated from each other by a predetermined side-by-side spacing 18. Desirably such spacing will lie within the range of 50–250 microns to permit probing of the pads 13 with a standard high frequency wafer probe 19.

The performance of the center photodiode 12b can be characterized in terms of Responsivity, R, which is the ratio of the electrical current flowing through the ends of the photodiode, as measured in amperes, over the optical power needed to establish this current, as measured in watts. As shown in FIG. 2, the center portion of the photodiode 12b includes an active region 20 which is sensitive to light and which faces the upper side 14 of the wafer. During testing, an optical signal is selectively applied to this active region by an optical probe 22 having a light emitting port 24, the probe being connected via optical cable to a lightwave analyzer test instrument (not shown).

Figure 3:
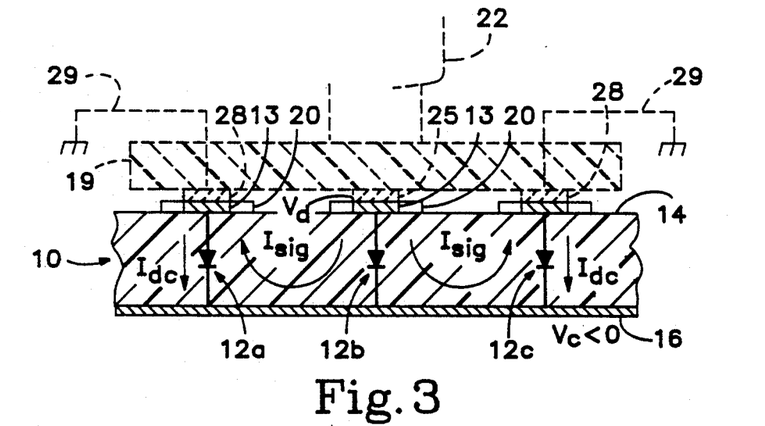
FIG. 3 is a partially schematic sectional view, taken along lines 3—3 of FIG. 2, where equivalent device models have been substituted for the photodiodes and showing the exemplary biasing method of the present invention.

In accordance with the exemplary method of the present invention, to permit measurement of the optical performance parameter R using a standard microwave probe 19 of the type having coplanar signal and ground conductors, the electrical biasing approach diagrammed in FIG. 3 is utilized. In particular, the signal conductor 25 at the tip end 26 (FIG. 3) of the probe 19 is positioned on the bond pad 13 of the photodiode 12b under test, whereas the ground conductors 28 of the probe are positioned on the respective bond pads 13 that connect with the pair of adjacent photodiodes 12a and 12c. A first voltage potential is applied between each ground conductor 28 of the probe and the ground plane 16 of the wafer 10 so that the adjacent photodiodes 12a and 12c are placed in a forward biased condition.

For example, when the cathode end of the photodiodes 12a–c are connected to the ground plate 16, as indicated in FIG. 3, each ground conductor 28 can be returned to ground 29, and the ground plane 16 can be set at a potential voltage, Vc, somewhat less than zero. This effectively creates a low inductance path from the ground conductors 28 of the probe to the ground plane 16 of the wafer, that is, to that end of the photodiode 12b that is located on the lower side of the wafer. It will be recognized that this connection is made without forming feedthrough or "via" holes in the wafer which would otherwise reduce the density of devices that could be fabricated on the wafer. Also shown in FIG. 3 are the paths traveled by the currents that can circulate under this biasing approach, including $I_{dc}$, the forward bias current of each adjacent photodiode 12a and 12c, and $I_{sig}$, the microwave modulated signal of the photodiode 12b during test.

Figure 4:
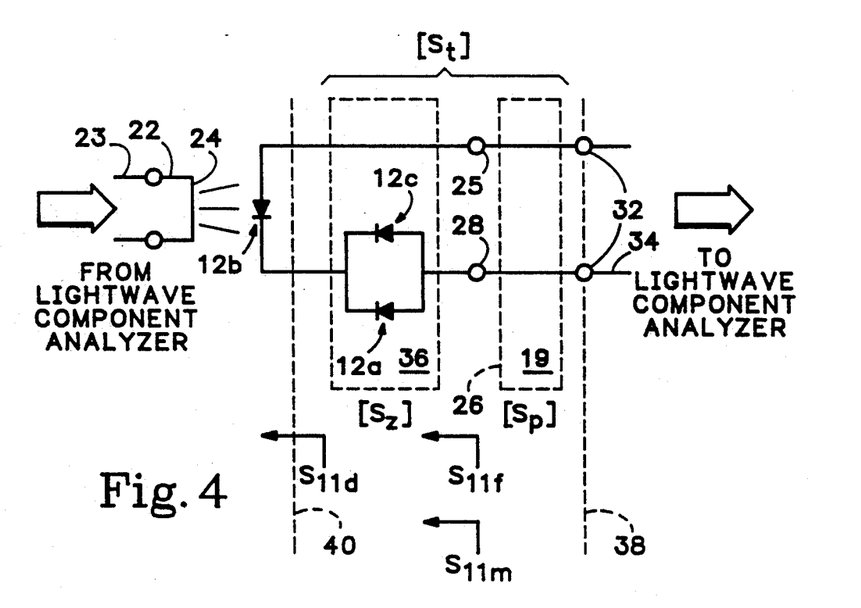
FIG. 4 is a signal flow diagram representing the overall measurement environment of the photodiode under test when biased, as shown in FIG. 3, including the optical interface, the immediate on-wafer network environment, and the electrical interface.

Referring to FIG. 4, the overall measurement environment in which the center photodiode 12b is tested is represented in terms of a signal flow diagram. At the tip end 26 of the probe 19, due to the above-described biasing approach, the adjacent photodiodes 12a and 12c act as a parallel connection of forward biased diodes that return the lower end of the center photodiode 12b to the ground conductors 28, both of which are tied together at ground. The upper end of the photodiode 12b is returned directly to the signal conductor 25. Also shown is the measurement port 32 that is provided at the end of the measurement cable 34 and to which the probe 19 attaches. The other end of the measurement cable is returned to the lightwave component analyzer (not shown).

In addition to the electrical signal interface with the lightwave component analyzer, the center photodiode 12b also has an optical signal interface. As was described, this interface is provided by interaction between the active region 20 of the photodiode and the light emitting port 24 of an optical probe 22, the optical probe being connected via an optical cable 23 to the lightwave component analyzer.

Before measuring the responsivity of the center photodiode 12b using the setup shown in FIG. 4, the lightwave component analyzer is optically calibrated using a previously characterized photoreceiver attached to the measurement port 32, as was described in the Background. This has the effect of shifting the reference plane for subsequent optical measurements to the measurement port 32 and away from the ends of the center photodiode 12b. In accordance with an exemplary calibration method of the present invention, however, the effects of the intervening probe 19 and the return diode combination 36 are fully compensated for, as will be described, without the use of such specialized accessories as a probeable photodiode standard.

Although not part of the present method, because optical calibration is normally performed with the optical probe 22 removed, the phase shift resulting from the optical probe also must be compensated for. This shift, however, can be readily determined from the physical length and the index of refraction of the optical fiber used in the optical probe.

When measuring the responsivity of the center photodiode 12b using the setup shown in FIG. 4, the center photodiode is placed in its normally operating or reverse-biased condition. Referring again to FIG. 3, for the photodiode 12b having its cathode arranged as shown, this is done by applying a potential voltage $V_d$ to the signal conductor 25 of the probe 19 that is somewhat more negative than the potential voltage $V_c$ applied to the ground plane 16. Concurrently, an optical signal is applied at the optical port 24 and the optical performance or responsivity, $R_m$, of the photodiode 12b is measured into the signal conductor 25 and the ground conductor 28 of the probe.

The measured responsivity $R_m$ is generally a complex quantity having a magnitude and a phase. As indicated above, because of the optical calibration procedure used, the measured responsivity $R_m$ is defined from a first reference plane 38 that extends across the measurement port 32. The measured responsivity $R_m$, therefore, is not a direct measure of the intrinsic performance of the photodiode 12b. To find the adjusted or actual value of responsivity, $R_a$, as measured into a hypothetical 50Ω load arranged across the second reference plane 40, the network effects of the probe 19, the return diodes 12a and 12c, and the center photodiode 12b itself each need to be taken into account.

In accordance with the exemplary method of the present invention, the actual value of responsivity, $R_a$, can be expressed as a function of the measured value of responsivity, $R_m$, and as a function of the reflection coefficient $S_{11d}$ of the photodetector.

This relationship can be expressed as follows:

$$R_a = \frac{(1 - S_{22t}S_{11d})R_m}{S_{12t}} \quad (1)$$

Stated more generally, the exemplary method includes adjusting the measured value of an optical parameter of the photodiode, $R_m$, on the basis of a measurement-based value of an electrical parameter of the photodiode, $S_{11d}$. To compensate, as well, for the electrical effects of the return diodes 36 and the probe 19, an overall or "total" S-parameter set $[S_t]$ is included in the expression. This total S-parameter set $[S_t]$ is obtained by combining the S-parameter set $[S_z]$ characterizing the probe and the S-parameter set $[S_z]$ characterizing the return diodes 36.

The following description will mainly be devoted to describing how the underlying terms in Equation 1 are obtained, that is, to explaining in detail the exemplary calibration procedure of the present invention. As an aid to understanding the steps involved, the calibration procedure has been summarized in block diagram form in FIG. 5, and the reference planes that are associated with the various parameters have been identified in FIG. 4. As will be recognized by those of ordinary skill in the art, the individual steps depicted do not necessarily need to be performed in the particular order shown. The measurement of $R_m$, block 50, and the dependency of $R_a$ on $R_m$, $S_{11d}$, and $[S_t]$, block 60, have already been described.

Figure 5:
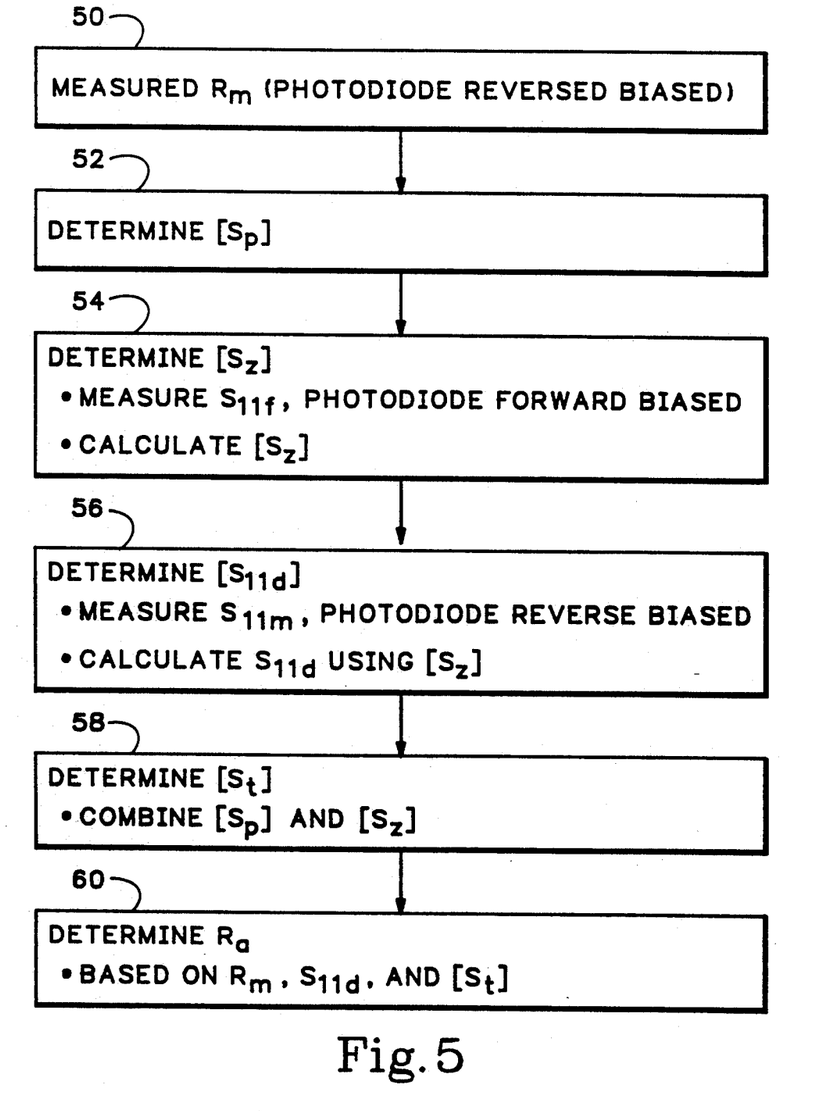
FIG. 5 is a block diagram outlining an exemplary calibration method in accordance with the present invention.

A step performed early in the calibration procedure is determining $[S_p]$, a set of network scattering parameters that characterize the probe by itself (block 52, FIG. 5). As used herein and throughout the specification, brackets denote a matrix set, so that $[S_p]$ can be written in expanded form as $$\begin{vmatrix} S_{11p} & S_{12p} \\ S_{21p} & S_{22p} \end{vmatrix}$$

Figure 6:
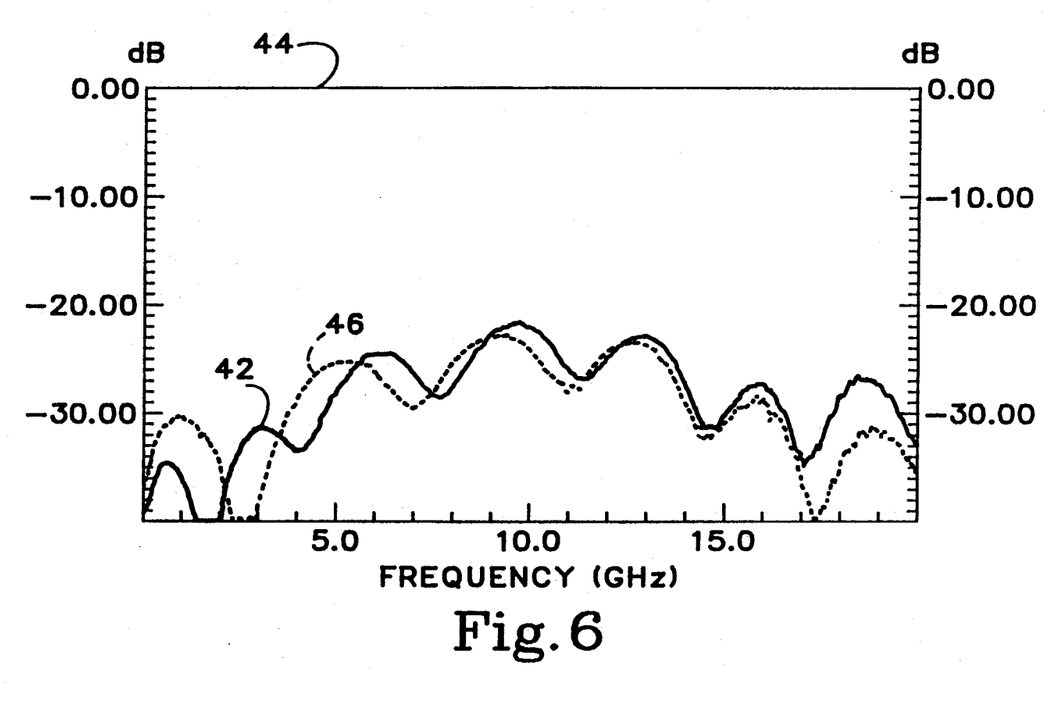
FIG. 6 shows a graph that plots typical values of magnitude for the S-parameters of a probe as determined in accordance with the method set forth in FIG. 5.

Techniques for determining $[S_p]$ are widely known in the art. In accordance with one such technique, for example, the probe is first removed from the measurement port 32 and one port calibration is done into coax so that a first error parameter set characterizing the cable 34 is found. Then the probe is reattached and three known impedance standards are measured at the tip end 26 of the probe so that a second error parameter set characterizing the probe 19 and cable 34 together is found. For this purpose, an impedance standard substrate (ISS) of the type sold by Cascade Microtech, Inc. of Beaverton, Oregon, is suitable. $[S_p]$ can then be calculated by solving for the ratio of the second error parameter set to the first error parameter set after each set has been transformed into its T-parameter equivalent and by performing the appropriate inverse transformation on the resulting solution. The standard equations which are involved in determining error parameter sets are described, for example, in Cascade Microtech, Inc., "Electrical Operation" *Model 22-42D Microwave Probe Station Instruction Manual*, Chap. 4, at 4-25 to 4-42 (1987). These equations also are described in Strid et al. U.S. Pat. No. 4,858,160 incorporated herein by reference, as well as in the following technical articles also incorporated herein by reference: Swanson, D., "Ferret Out Fixture Errors With Careful Calibration," *Microwaves, Jan. 1980, at 79–85; Fitzpatrick, J., "Error Models for Systems Measurement," *Microwave Journal*, May 1978, at 63–66. Typical values of magnitude for $S_{11p}$, $S_{21p}$, and $S_{22p}$ are plotted in the graph of FIG. 6 and are denoted by reference numerals 42, 44, and 46, respectively.

If a probeable photodetector standard happens to be available, the step of determining $[S_p]$ can be avoided because the reference plane for the optical signal measurement can be shifted to the tip end 26 (FIG. 4) of the probe instead of to the measurement port 38. Equation 1 will still apply in modified form, however, as described in the concluding remarks of this section.

When using the biasing scheme of FIG. 3, it is important to characterize the network effects that are introduced, at high frequencies, due to the presence of the diodes 36 (FIG. 4) in the return path. This is done by determining the S-parameter set $[S_z]$ that characterizes the measurement network between the photodiode 12b and the tip end 26 of the probe 19 (block 54, FIG. 5).

In determining $[S_z]$, an electrical signal is applied at the tip end 26 of the probe 19 to the network that includes the photodiode 12b and the return diodes 36 so that the unified reflection coefficient $S_{11f}$ (FIG. 4) can be measured. The earlier determination of $[S_p]$ (block 52, FIG. 5) permits the reference plane of this and other subsequent electrical measurements to be shifted to the tip end 26 of the probe as shown. The reflection coefficient $S_{11f}$ is "unified" in the sense that it is measured with each photodiode $12_{a-c}$ operating in a forward-biased or unified manner. For the particular photodiode arrangement of FIG. 3, for example, during application of the electrical signal, the photodiode 12b is placed in a forward-biased condition by changing the potential voltage $V_d$ on the signal conductor 25 of the probe to a somewhat more positive voltage than the potential voltage $V_c$ on the ground plane 16 of the wafer 10.

Based on the assumption that the forward biased impedance Z of each photodiode $12a-c$ is equal (a reasonable assumption because of their substantially identical physical geometry), the impedance of each device can then be determined from the following equation:

$$Z = \frac{Z_0(1 + S_{11f})}{3(1 - S_{11f})} \quad (2)$$

In turn, the series S-parameter set $[S_z]$ that characterizes the parallel combination of the return diodes 36 is determined by the following expressions:

$$S_{11z} = S_{22z} = \frac{Z/Z_o}{Z/Z_o + 2} \quad (3)$$

$$S_{21z} = S_{12z} = \frac{2}{Z/Z_o + 2} \quad (4)$$

Figure 7:
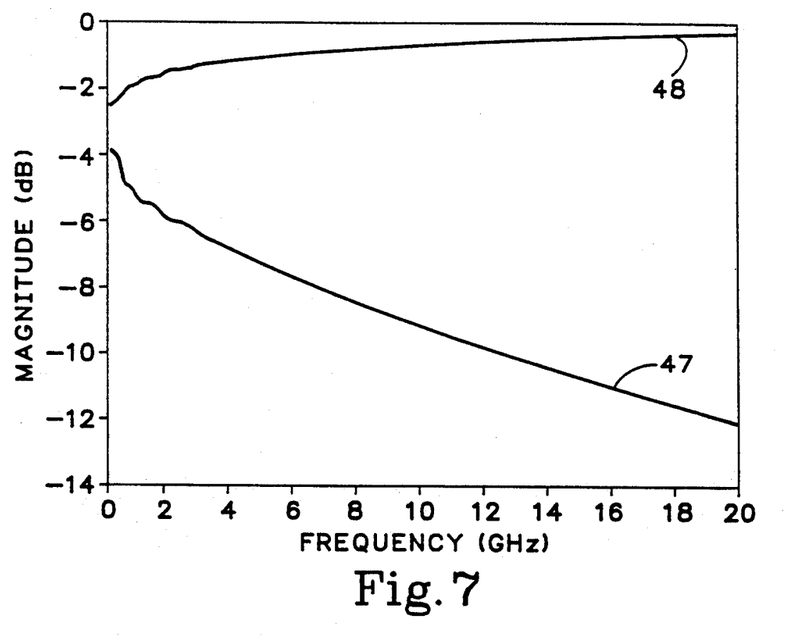
FIG. 7 shows a graph that plots typical values of magnitude for the S-parameters of the return path diodes as determined in accordance with the method set forth in FIG. 5.
Figure 8:
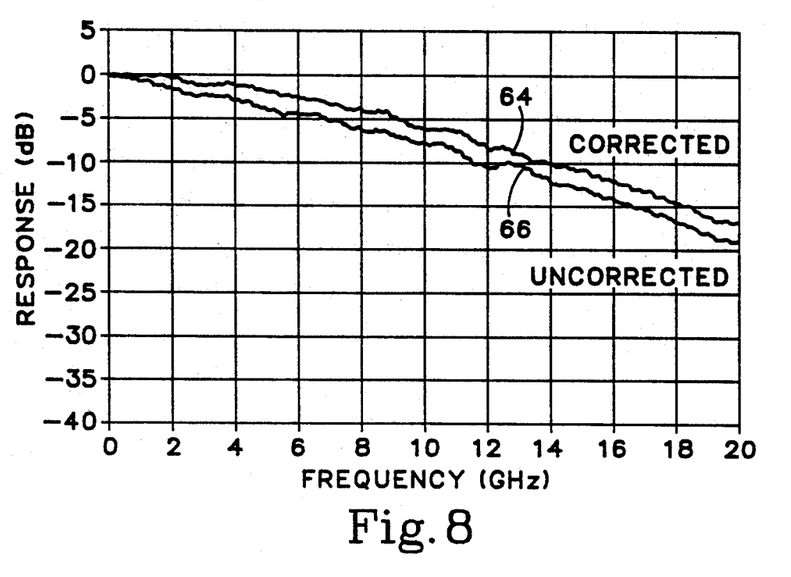
FIG. 8 shows a graph having upper and lower plotted values, the lower plotted values corresponding to measured magnitudes of the responsivity of the photodiode before calibration, and the upper plotted values corresponding to determine magnitudes for the responsivity of the photodiode after calibration.

Typical values of magnitude 47 for $S_{11z}$, or $S_{22z}$, and values of magnitudes 48 for $S_{21z}$, or $S_{12z}$ are plotted in the graph of FIG. 7. This graph indicates that the characteristics of the return diodes 36 (FIG. 4) matches that of a series resistance shunted by a capacitance.

If the photodetector is entirely top mounted, so that the biasing scheme of FIG. 3 is not used, the step of determining $[S_z]$ is not necessary as there is no contribution by a return diode combination. In any event, Equation 1 will still apply in modified form as described in the concluding remarks of this section.

An important aspect of the present invention is the adjustment of the measured value of an optical parameter $R_m$ of the photodiode 12b on the basis of a measurement-based value of an electrical parameter $S_{11d}$ of the photodiode (block 60, FIG. 5). To determine $S_{11d}$ (block 56, FIG. 5) the photodiode 12b is again placed in reversed biased condition. For the particular arrangement of FIG. 3, where the cathode of the photodiode 12b connects to the ground plane 16, this is done by applying a potential voltage $V_d$ to the signal conductor 25 of the probe 19 that is somewhat more negative than the potential voltage $V_c$ applied to the ground plane 16. Concurrently, an electrical signal is applied at the tip end 26 of the probe 19 to the network that includes the photodiodes 12b and the return diodes 36 so that the "aggregate" reflection coefficient $S_{11m}$ (FIG. 4) can be measured. Here the descriptive term "aggregate" is applied to suggest the electrical combination of the center diode 12b with the return diodes 12a and 12c when their respective mode of operation is different and can be contrasted with the descriptive term "unified" applied earlier to $S_{11f}$. The reflection coefficient $S_{11d}$ of the photodiode 12b, characterizing the intrinsic electrical response of the photodiode from a reference plane 40 directly across from the photodiode, can be determined from the values of $S_{11m}$ and $[S_z]$ by the following expression:

$$S_{11d} = \frac{S_{11m} - S_{11z}}{S_{22z}(S_{11m} - S_{11z}) + S_{21z}S_{12z}} \quad (5)$$

Before determining $R_a$ (block 60, FIG. 5), it is necessary to calculate $[S_t]$ (block 58, FIG. 5). As already described, the "total" S-parameter set $[S_t]$ is obtained by combining the S-parameter set $[S_p]$ of the probe and the S-parameter set $[S_z]$ characterizing the return diodes 36. In particular, a T-parameter or ABCD transformation can be used, as is well known in the art, so that $[S_p]$ and $[S_z]$ are transformed into respective T-parameter or ABCD matrices, the matrices are multiplied, and an appropriate inverse transformation is done on the resulting product matrix to give $[S_t]$. The necessary equations are as follows:

T-parameter equations $$T_{11} = 1/S_{21} \qquad S_{11} = T_{21}/T_{11}$$
$$T_{12} = -S_{22}/S_{21} \qquad S_{21} = 1/T_{11} \qquad (6)$$
$$T_{21} = S_{11}/S_{21} \qquad S_{12} = T_{22} - T_{21}T_{12}/T_{11}$$
$$T_{22} = S_{12} - S_{11}S_{22}/S_{21} \qquad S_{22} = -T_{12}/T_{11}$$

ABCD-parameter equations

-continued $$A = \frac{(1 + S_{11})(1 - S_{22}) + S_{12}S_{21}}{2S_{21}} \quad \frac{A + B - C - D}{A + B + C + D} \quad \frac{2(AD - BC)}{A + B + C + D} \quad (7)$$

$$B = \frac{(1 + S_{11})(1 + S_{22}) - S_{12}S_{21}}{2S_{12}}$$

$$C = \frac{(1 - S_{11})(1 - S_{22}) - S_{12}S_{21}}{2S_{21}}$$

$$D_{22} = \frac{(1 - S_{11})(1 + S_{22}) + S_{12}S_{21}}{2S_{21}} \quad \frac{2}{A + B + C + D)} \quad \frac{-A + B - C + D}{A + B + C + D}$$

The final step in the calibration method of the present invention involves solving Equation 1 to find the adjusted or actual responsivity, $R_a$, of the photodiode 12b (block 60, FIG. 5). FIG. 9 shows values 64 for the magnitude of $R_a$, determined in accordance with the invention, plotted together on the same graph with measured values 66 for the magnitude of $R_m$. From FIG. 9 it will be recognized that the series resistance introduced by the return diodes 36 in the ground path causes the measured or uncalibrated response 66 to roll off at a lower frequency than the adjusted or calibrated response 64. This makes it appear that the performance of the photodiode 12b is worse than it actually is.

It will be recognized that although an exemplary method of practicing the present invention has been described, the broader principles of the invention will encompass other methods as well. For example, regarding the biasing method best exemplified in FIG. 3, in place of the adjacent photodiodes 12a and 12c that are shown, it is possible to use other types of devices that have diode-like characteristics, although it is preferable, for optical calibration accuracy, that the physical geometry of each device 12a-c be identical. Moreover, in addition to a photodiode 12b, various other types of two-terminal devices can be tested on-wafer using a standard probe and the described biasing method.

Regarding the calibration method best exemplified in FIG. 5, the method can still be utilized even where the photodetector is entirely top mounted, that is, has contacts for both of its ends on the upper side of the wafer. In such a situation, there is no contribution by a return diode combination, so it is necessary to accordingly modify Equation 1 by substituting $S_{22p}$ for $S_{22t}$ and $S_{12p}$ for $S_{12t}$. This approach makes accurate measurement of the actual performance of the photodetector possible, even when a probeable photodetector standard is unavailable. Alternatively, a probeable photodetector standard may be available, but the ends of the photodetector may be of the noncoplanar type described herein. As $[S_p]$ is no longer a factor, Equation 1 is accordingly modified by substituting $S_{22z}$ for $S_{22t}$ and $S_{12z}$ for $S_{12t}$. It will further be recognized that optical performance parameters other than responsivity may be calibrated using the principles of the present invention, such as those that relate to dynamic response.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method for on-wafer testing of microwave devices comprising:
   (a) providing a wafer of the type having a lower side with a ground plane and an opposing upper side and having a microwave device connected between a first probeable contact on the upper side of said wafer and said ground plane on the lower side thereof;
   (b) providing a diode arranged side-by-side with said microwave device and connected between a second probeable contact on the upper side of said wafer and said ground plane on the lower side thereof, said first and second probeable contacts having a predetermined side-by-side spacing therebetween;
   (c) providing a microwave probe having a signal conductor in coplanar relation with a ground conductor, said signal conductor and ground conductor having a side-by-side spacing corresponding to said predetermined side-by-side spacing between said first and second probeable contacts;
   (d) placing the diode in a forward biased condition by applying a first voltage between said ground conductor and the ground plane of the wafer; and
   (e) during step (d), measuring via said signal conductor and said ground conductor a performance parameter characterizing said microwave device.

2. The method of claim 1, wherein said microwave device is a photodetector and the method further includes the step of placing said photodetector in a reverse-biased condition by applying a second voltage between said signal conductor and the ground plane of the wafer.

3. The method of claim 2 wherein the method further includes the step of placing said photodetector in a forward-biased condition by applying a third voltage between said signal conductor and the ground plane of the wafer.

4. The method of claim 3 wherein said diode is substantially identical in physical geometry to said photodetector.

5. The method of claim 1 wherein said performance parameter measured in step (e) characterizes said microwave device from a first reference plane including the microwave device in combination with the diode.

6. The method of claim 5, further including the step of determining an adjusted value for said performance parameter characterizing said microwave device from a second reference plane including said microwave device apart from the diode.

7. The method of claim 5, wherein said microwave device is a photodetector and the method further includes the step of providing light emitting means for selectively applying an optical signal to said photodetector, said performance parameter characterizing the response of said photodetector to said optical signal.

8. The method of claim 7, further including the step of determining an adjusted value for said performance parameter, said adjusted value characterizing the response of said photodetector to said optical signal from a second reference plane including said photodetector apart from the diode.

9. The method of claim 8 wherein said microwave probe includes means for applying an electrical signal to said photodetector and further including the step of measuring via said signal conductor and said ground conductor a network parameter characterizing the response of said photodetector to said electrical signal.

10. The method of claim 8 wherein the step of determining said adjusted value includes determining an intrinsic network parameter characterizing the electrical response of said photodetector apart from the diode.

11. The method of claim 10 wherein said intrinsic network parameter is a reflection coefficient.

12. The method of claim 10 wherein the step of determining said intrinsic network parameter includes measuring an aggregate network parameter characterizing the electrical response of said photodetector in reversedbiased condition from a reference plane including said photodetector and the diode.

13. The method of claim 10 wherein the step of determining said intrinsic network parameter includes determining a set of network parameters characterizing the electrical response of the diode apart from said photodetector.

14. The method of claim 13 wherein the step of determining said set of network parameters includes measuring a unified parameter characterizing the electrical response of said photodetector in a forwardbiased condition from a reference plane including said photodetector and the diode.

15. The method of claim 8 wherein the step of determining said adjusted value includes determining a first set of network parameters characterizing the electrical response of the microwave probe itself.

16. The method of claim 8 wherein the step of determining said adjusted value includes determining a second set of network parameters characterizing the electrical response of the diode apart from said photodetector.

17. The method of claim 8 wherein the step of determining said adjusted value includes determining a third set of network parameters characterizing the electrical response of the microwave probe and the diode together with each other and apart from said photodetector.

18. A method for on-wafer testing of microwave photodetectors comprising:
 (a) providing a wafer supporting a photodetector thereon,
 (b) providing light emitting means for selectively applying an optical signal to said photodetector;
 (c) providing a microwave probe for measuring said photodetector and for applying an electrical signal to said photodetector;
 (d) probing said photodetector with the microwave probe including measuring a performance parameter characterizing the response of said photodetector to said optical signal from a first reference plane;
 (e) probing said photodetector with the microwave probe including measuring a network parameter characterizing the response of said photodetector to said electrical signal; and
 (f) determining an adjusted value for said performance parameter based on said network parameter so that the response of said photodetector to said optical signal is characterized from a second reference plane nearer to said photodetector than said first reference plane.

19. The method of claim 18, further including the step of providing a cable having a measurement port adapted for connection to said microwave probe.

20. The method of claim 19 wherein step (d) characterizes the response of said photodetector to said optical signal from a first reference plane aligned with said measurement port.

21. The method of claim 20, further including the step of separately measuring a first set of network parameters characterizing the microwave probe itself.

22. The method of claim 18 wherein said network parameter is a reflection coefficient.

23. The method of claim 18 wherein said performance parameter is the responsivity of said photodetector.

24. The method of claim 18 adapted for testing said photodetector when the wafer has an upper and lower side, wherein said photodetector is connected between the upper and lower side, and the microwave probe has a tip including a signal conductor and a ground conductor in coplanar relationship to each other, wherein steps (d) and (e) of the method include the step of simultaneously probing said photodetector with said signal conductor and said ground conductor.

* * * * *

UNITED STATES PATENT AND TRADEMARK OFFICE
CERTIFICATE OF CORRECTION

PATENT NO. : 5,159,262

DATED : October 27, 1992

INVENTOR(S) : Scott H. Rumbaugh et al.

It is certified that error appears in the above-identified patent and that said Letters Patent is hereby corrected as shown below:

Col. 2, Line 66    Delete "reference" and insert --performance--.

Col. 3, Line 57    Delete "of" (first occurrence) and insert --for--.

Col. 6, Line 14    Delete "$[S_z]$" and insert --$[S_p]$--;

Line 46    Delete "one port" and insert --one-port--.

Col. 11 Line 34    After "unified" insert --network--.

Signed and Sealed this

Twenty-ninth Day of March, 1994

Attest:

BRUCE LEHMAN

Attesting Officer       Commissioner of Patents and Trademarks